United States Patent
Aslan et al.

(10) Patent No.: US 12,088,299 B2
(45) Date of Patent: Sep. 10, 2024

(54) CLOCK DISTRIBUTION WITH TRANSIMPEDANCE AMPLIFIER AND BIQUAD FILTER

(71) Applicant: TEXAS INSTRUMENTS INCORPORATED, Dallas, TX (US)

(72) Inventors: Hesam Aslan, San Jose, CA (US); Ramsin Ziazadeh, San Jose, CA (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/059,599

(22) Filed: Nov. 29, 2022

(65) Prior Publication Data

US 2024/0178820 A1    May 30, 2024

(51) Int. Cl.
*H03K 3/012* (2006.01)
*H03F 3/45* (2006.01)
*H03H 11/04* (2006.01)
*H03K 17/687* (2006.01)

(52) U.S. Cl.
CPC ......... *H03K 3/012* (2013.01); *H03F 3/45179* (2013.01); *H03H 11/04* (2013.01); *H03K 17/6871* (2013.01)

(58) Field of Classification Search
CPC ....................................... H03K 3/012

USPC ......................................................... 327/103
See application file for complete search history.

(56) References Cited

U.S. PATENT DOCUMENTS

| | | | | |
|---|---|---|---|---|
| 8,289,009 B1* | 10/2012 | Strik | ........ | G05F 1/575 323/280 |
| 9,559,792 B1* | 1/2017 | Amir-Aslanzadeh | ........ | H04B 17/12 |
| 2003/0114129 A1* | 6/2003 | Jerng | ........ | H04B 1/18 455/333 |
| 2006/0234665 A1* | 10/2006 | Bagheri | ........ | H03D 7/1441 455/323 |
| 2024/0006992 A1* | 1/2024 | Seetharaman | ........ | H02M 1/0025 |

* cited by examiner

*Primary Examiner* — Tomi Skibinski
(74) *Attorney, Agent, or Firm* — John R. Pessetto; Frank D. Cimino

(57) ABSTRACT

An integrated circuit (IC) includes a voltage-to-current converter circuit having a first voltage terminal, a second voltage terminal, a first current terminal, and a second current terminal. A transimpedance amplifier (TIA) and biquad filter circuit has a first TIA and biquad filter input coupled to the first current terminal and has a second TIA and biquad filter input coupled to the second current terminal. The transimpedance amplifier includes cross-coupled transistors configured to use positive feedback.

20 Claims, 7 Drawing Sheets

CLOCK DISTRIBUTION WITH TRANSIMPEDANCE AMPLIFIER AND BIQUAD FILTER

BACKGROUND

Many integrated circuits (ICs) include clock signals (referred to herein as "clocks") that are propagated across the IC. Although ICs are generally small, such distances for high-speed clocks are problematic. For example, the transmission line for a clock is characterized by a resistance and a capacitance that may limit the bandwidth for the clock. To overcome such bandwidth limitations, some clock distribution architectures may include multiple complementary metal oxide semiconductor (CMOS) buffers every, for example, 100-200 micrometers (microns) or current mode logic (CLM) buffers every 500 microns. Such buffers occupy area in or on the IC and consume power.

SUMMARY

In one example, an integrated circuit (IC) includes a voltage-to-current converter circuit having a first voltage terminal, a second voltage terminal, a first current input/output (I/O), and a second current (I/O). A transimpedance amplifier (TIA) and biquad filter circuit has a first TIA and biquad filter input coupled to the first current I/O and has a second TIA and biquad filter input coupled to the second current I/O. The transimpedance amplifier includes cross-coupled transistors configured to use positive feedback.

DETAILED DESCRIPTION

Figure 1:
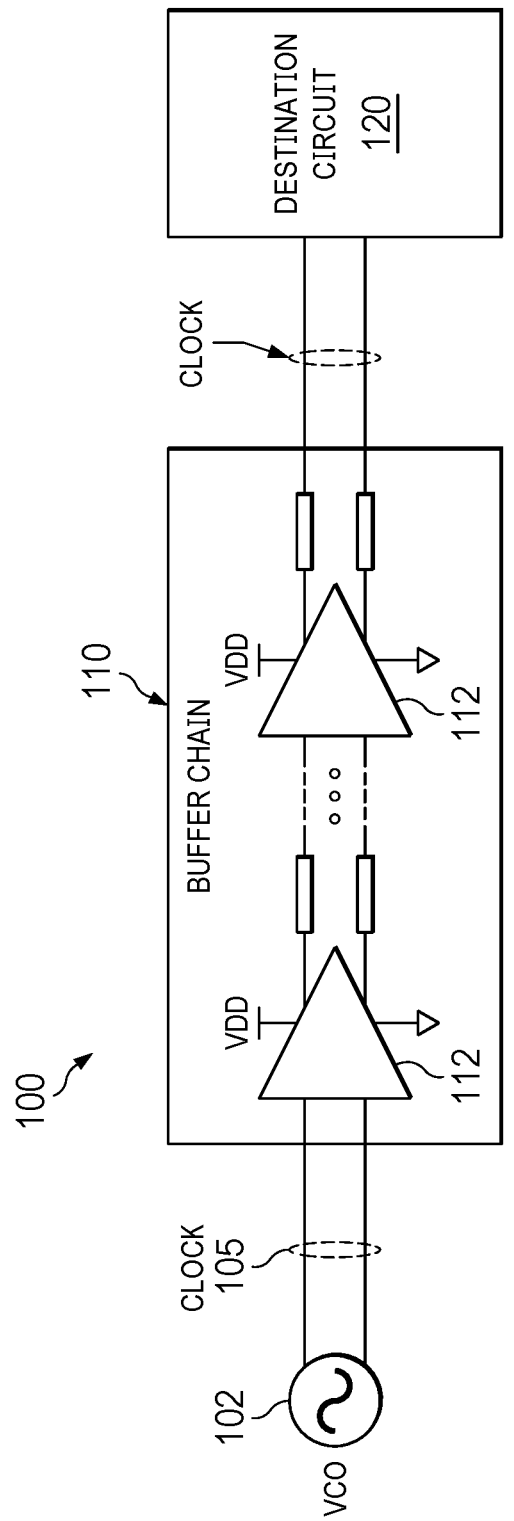
FIG. 1 is a schematic of an example clock distribution system including.

The same reference numbers or other reference designators are used in the drawings to designate the same or similar (either by function and/or structure) features.

FIG. 1 is a block diagram of an example of a clock distribution system 100 usable within, for example, an IC. The clock distribution system 100 includes an example voltage-controlled oscillator (VCO) 102, an example buffer chain 110, and an example destination circuit 120. The VCO 102 is coupled to the buffer chain 110, and the buffer chain 110 is coupled to the destination circuit 120.

The VCO 102 generates a clock signal (CLOCK) 105. Other types of circuits (crystal oscillators, phase-locked loops, etc.) may be used to generate CLOCK 105. The buffer chain 110 includes one or more CMOS or CML buffers 112 to transmit CLOCK from the source end of the clock distribution system 100 (e.g., from the VCO's output) to the destination circuit 120. The destination circuit is a circuit that operates using CLOCK. The destination circuit may include, for example, a microcontroller, one or more flip-flops, or other types of circuit components whose states may be sequenced at the rising and/or falling edges of CLOCK.

Each buffer 112 operates from a supply voltage, Vdd, and thus consumes power. All else being equal, an IC that consumes less power is more desirable than an IC that consumes more power. Further, routing the supply voltage Vdd and ground to the various buffers 112 may provide a significant challenge for laying out the connections within the IC. Further still, duty cycle distortion may exist in the clock distribution system 100 of FIG. 1. Accordingly, the clock distribution system 100 may include duty cycle distortion detection circuitry and calibration circuitry between the last buffer 112 and the destination circuit 120. Such duty cycle distortion detection circuitry and calibration circuitry disadvantageously consume power and occupy space on a semiconductor die or circuit board.

Figure 2:
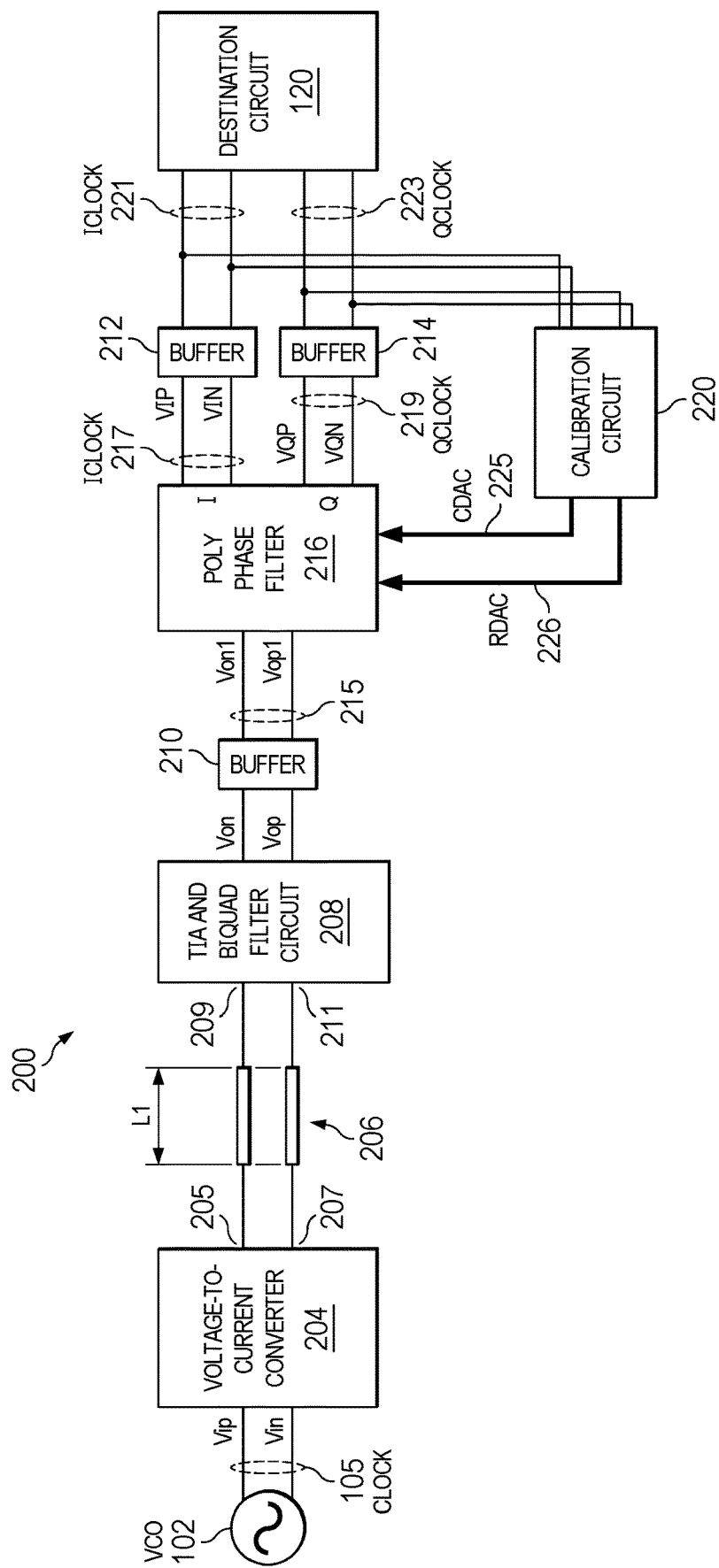
FIG. 2 is a schematic of an example clock distribution system including a transimpedance amplifier and a biquad filter.

FIG. 2 is a block diagram of another example clock distribution system. The components of the clock distribution system 200 may be implemented on an IC to generate and distribute a clock to a destination circuit 120 that may also be on the same IC. In other examples, two or more of the components of the clock distribution system 200 are implemented on separate ICs. Clock distribution system 200 includes the VCO 102, a voltage-to-current converter 204, a transimpedance amplifier ("TIA") and biquadratic ("biquad") filter 208, buffers 210, 212, and 214, a polyphase filter 216, and a calibration circuit 220. The voltage-to-current converter 204 may also be referred to as an operational transconductance amplifier (OTA).

The VCO 102 generates CLOCK 105 as a voltage signal switching repeatedly between higher and lower voltage values. CLOCK 105 is provided to inputs Vip and Vin of the voltage-to-current converter 204. The voltage-to-current converter 204 converts voltage-based CLOCK 105 to a current which flows between the terminals 205 and 207 of the voltage-to-current converter 204 and the corresponding terminals 209 and 211 of the TIA and biquad filter circuit 208 across a channel 206. Channel 206 includes a conductor interconnecting the terminal 205 to the terminal 209. Channel 206 also includes a conductor interconnecting the terminal 207 to the terminal 211. The length L1 of the conductors may be several thousand microns long (e.g., 1000 microns, 1500 microns, or 2000 microns, etc.). In one example, the channel 206 does not include any buffers or repeaters, as was otherwise included in the example of FIG. 1. Such buffers are not needed in the example of FIG. 2 because, as will be described below, the input impedance to the TIA and biquad filter circuit 208 is low (approximately 0 ohms). Further, the cross-sectional area of the conductors comprising channel 206 are large enough such that the resistance of the conductors is small.

The TIA and biquad filter circuit 208 includes a low-pass filter having a cut-off frequency above the fundamental frequency of CLOCK 105, but below the harmonics of the fundamental frequency. The TIA and biquad filter circuit 208 converts the input current-based clock signal to a voltage-based sinusoidal signal at the same frequency as CLOCK 105. The output sinusoidal signal from the TIA and biquad filter circuit 208 is provided at its Von and Vop output terminals, which are coupled to buffer 210. Buffer 210 provides at least one of a high input impedance and voltage level shifting and provides a buffered sinusoidal signal, Von and Vop signals, 215 as an input to the polyphase filter 216.

The polyphase filter 216 includes inputs Vop1 and Von1, which receive the buffered Von and Vop signals 215 from buffer 210. The polyphase filter 216 converts the input sinusoidal signal to a clock signal (e.g., approximately a square wave) whose fundamental frequency is or is approximately the same as CLOCK 105. The polyphase filter 216 produces two output clocks referred to as the "ICLOCK" 217 and the "QCLOCK" 219. The ICLOCK and QCLOCK are nominally (during runtime at steady state) of the same frequency and same amplitude but are phase-shifted from each other by approximately 90 degrees. The ICLOCK and QCLOCK (also referred to as quadrature clocks) are useful in various applications such as clock and data recovery circuits. The ICLOCK is output from polyphase filter 216 on output terminals VIP and VIN, and the QCLOCK is output on output terminals VQP and VQN.

The ICLOCK 217 is buffered by buffer 212, and the QCLOCK 219 is buffered by buffer 214. Buffers 212 and 214 may provide high input impedances and/or voltage-level shifting as desired. The buffered ICLOCK 221 and QCLOCK 223 are provided to the destination circuit 120 and to corresponding inputs of the calibration circuit 220. The calibration circuit 220 implements a calibration process by which the polyphase filter 216 is adjusted such that the amplitudes of the quadrature clocks (ICLOCK and QCLOCK) are approximately equal or that the phase shift between the quadrature clocks is approximately 90 degrees. The calibration circuit 220 (described below) provides control signals CDAC 225 and RDAC 226 to the polyphase filter 216, responsive to which the polyphase filter adjusts the relative amplitudes of and/or phase shift between the quadrature clocks.

Figure 3:
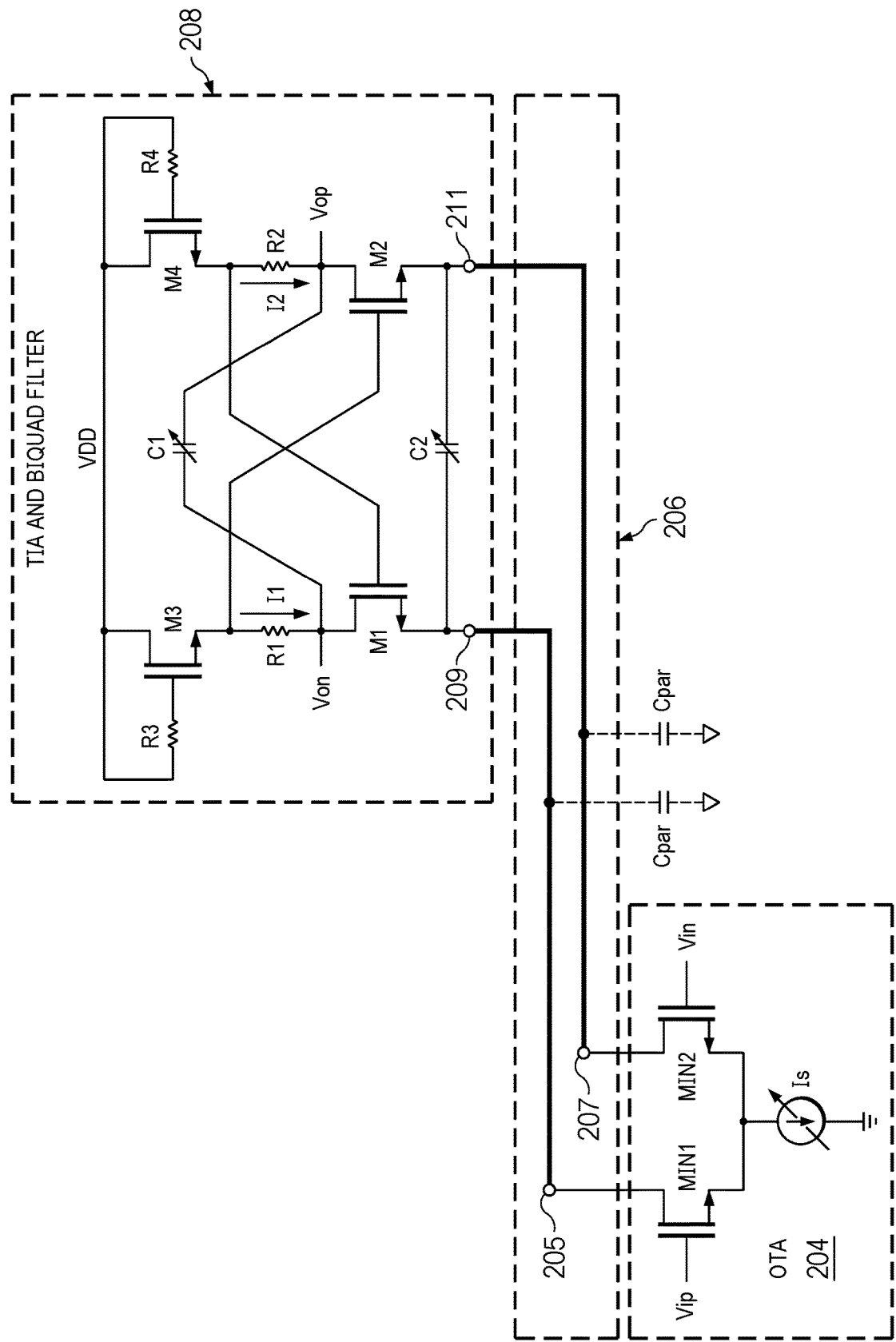
FIG. 3 is a schematic of an example transimpedance amplifier and biquad filter usable in the clock distribution system of FIG. 2.

FIG. 3 is a schematic showing an example implementation of the voltage-to-current converter 204 and the TIA and biquad filter circuit 208. The voltage-to-current converter 204 includes transistors MIN1 and MIN2 and a current source circuit Is1 ("Is1" refers to both the circuit that produces the current and the magnitude of the current itself). In this example, transistors MIN1 and MIN2 are n-channel field effect transistors (NFETs). Input Vip is coupled to the gate of transistor MIN1, and input Vin is coupled to the gate of transistor MIN2. A first terminal of current source circuit Is1 is coupled to an electrical ground terminal or simply ground terminal. In an example, the ground terminal is a ground plane of an IC that contains the OTA 204 or is one or more conductors connected to the ground plane of the IC, which provides an electrical ground for the IC. As used herein, a terminal being coupled to ground also refers to the terminal being coupled to an electrical ground terminal. A second terminal of the current source circuit Is1 is coupled to the sources of transistors MIN1 and MIN2. The drains of transistors MIN1 and MIN2 are coupled, respectively, to the terminals 205 and 207 of the OTA 204. Accordingly, in this example, the terminals 205 and 207 of the OTA 204 are the respective drains of the transistors MIN1 and MIN2.

The total bias current through the transistors MIN1 and MIN2 is Is1. The portion of Is1 that flows through each transistor MIN1 and MIN2 is a function of the relative magnitude of the CLOCK 105 voltages at the inputs Vip and Vin. Accordingly, as the voltages on inputs Vip and Vin switch between voltage levels, the amount of current that flows through each transistor MIN1 and MIN2 also changes, thereby converting CLOCK 105 in the form of the voltage difference between the voltages on the inputs Vip and Vin to a current-based clock signal on channel 206.

The example implementation in FIG. 3 of the TIA and biquad filter circuit 208 includes transistors M1, M2, M3, and M4, resistors R1, R2, R3, and R4, and trimmable or adjustable capacitor circuits C1 and C2. Trimmable capacitor circuits C1 and C2 are also referred to herein as trimmable capacitors, each of which can include a single adjustable capacitor, a single adjustable capacitor and switch, multiple capacitors and corresponding switches, etc. In general, transistors M1-M4 are transistors of the same type, in which "type" means that the transistors are all FETs or are all bipolar junction transistors (BJTs), etc. and all four transistors have conducting channels of the same polarity (e.g., n-channel or p-channel). By having transistors M1-M4 all be implemented as the same type, the transconductances of the transistors advantageously track the same through variations in process, supply voltage, and temperature, which helps to ensure a low input impedance (virtual ground) for the TIA and biquad filter circuit 208 across process, supply voltage, and temperature.

In this example, the sources of transistors M1 and M2 are coupled, respectively, to the terminals 209 and 211 of the TIA and biquad filter circuit 208. Accordingly, the terminals 209 and 211 the TIA and biquad filter circuit 208 are the respective sources of the transistors M1 and M2. Capacitor C2 is coupled between the sources of transistors M1 and M2. Capacitor C1 is coupled between the drains of transistors M1 and M2. The source of transistor M1 is coupled over channel 206 (via a first conductor) to the drain of transistor MIN1, and the source of transistor M2 is coupled over channel 206 (via a second conductor) to the drain of transistor MIN2. Resistor R1 is coupled between the source of transistor M3 and the drain of transistor M1. R2 is coupled between the source of transistor M4 and the drain of transistor M2. Resistor R3 is coupled between a supply voltage terminal VDD and the gate of transistor M3. Resistor R4 is coupled between the supply voltage terminal VDD and the gate of transistor M4. The supply voltage terminal VDD receives a supply voltage (also referred to as VDD). In an example, the supply voltage terminal is one or more conductors in an IC that connects to a voltage supply that is internal or external to an IC that contains that TIA and biquad filter circuit 208, in which the voltage supply provides voltage VDD.

Transistors M1-M4 are cross-coupled, meaning in this example that the source of transistor M4 is coupled to the gate of transistor M1, and the source of transistor M3 is coupled to the gate of transistor M2. In general, four cross-coupled capacitors refer to a circuit configuration in which a (current) terminal of a fourth transistor is coupled to a control input of a first transistor, and a (current) terminal of a third transistor is coupled to the control terminal of the second transistor. The drains of transistors M3 and M4 are coupled together and to supply voltage terminal VDD. Transistors M3 and M4 are biased into the saturation region as a result of their gates being coupled to the voltage terminal VDD through resistors R3 and R4. The connection between the drain of transistor M1 and resistor R1 is the output Von. The connection between the drain of transistor M2 and resistor R2 is the output Vop.

As shown, transistors M1 and M3 and resistor R1 can be said to form a lefthand branch of the TIA and biquad filter circuit 208. Similarly, transistors M2 and M4 and resistor R2 can be said to form a righthand branch of the TIA and biquad filter circuit 208. The current that flows through transistor MIN1 also flows through the lefthand branch of the TIA and biquad filter circuit 208 as current I1. Similarly, the current that flows through transistor MIN2 also flows through the righthand branch of the TIA and biquad filter circuit as current I2. Current I1 flowing through resistor R1 creates a voltage difference across resistor R1. Current I2 flowing through resistor R2 creates a voltage difference across resistor R2. Accordingly, changes in magnitudes of currents through transistors MIN1 and MIN2 cause corresponding voltage changes across resistors R1 and R2, thereby converting the current-based clock signal back to a voltage-based clock signal. The resulting voltage-based clock signal is the voltage difference between voltages at the outputs Vop and Von.

As previously mentioned, the source of transistor M4 is coupled to the gate of transistor M1, and the source of transistor M3 is coupled to the gate of transistor M2. Accordingly, if the voltage on the source of transistor M1 rises (due to, for example, a decrease in the magnitude of current I1), the voltage on the source of transistor M3 also rises. At the same time, the voltages on the sources of transistors M2 and M4 decrease (due to a corresponding increase in the magnitude of current I2).

M1 is a source follower transistor, which means the voltage on the source of transistor M1 follows the voltage induced on the gate of transistor M1, but in an opposite direction (sign), thereby creating a virtual ground at the source of transistor M1 and thus creating a low-impedance transimpedance stage. The voltage on the gate of transistor M1 is the mirror opposite of the voltage on the source of transistor M4. Thus, as the voltage on the source of transistor M4 decreases, the source-follower nature of transistor M1 causes the voltage on the source of transistor M1 to decrease thereby counterbalancing the increase in its voltage and maintain the voltage on the source of transistor M1 at approximately 0 volts. Accordingly, any increase in the voltage on the source of transistor M1 due to current I1 is approximately counterbalanced by a corresponding decrease in the voltage of the source of transistor M4. Similarly, any decrease in the voltage on the source of transistor M1 is counterbalanced by a corresponding increase in the voltage of transistor M4. A similar voltage-balancing process occurs on the source of transistor M2.

Accordingly, the voltages on the terminals 209 and 211 of the TIA and biquad filter circuit 208 remain at approximately 0 volts, which effectively creates an input impedance of approximately 0 ohms. Mathematically, the input impedance of the TIA and biquad filter circuit 208 is proportional to (1/gm1-1/gm3) where gm1 is the transconductance of transistors M1 and gm3 is the transconductance of transistor M3. As noted above, the transistors M1-M4 are all of the same type (all FETs or all BJTs and all have the same conducting channel polarity). Because transistors M1-M4 are all of the same type, the difference between 1/gm1 and 1/gm3 advantageously remains relatively small despite variations in process, supply voltage, and temperature.

As described above, transistors M1-M4 are cross-coupled in a positive feedback configuration which advantageously reduces the input impedance of the TIA and biquad filter circuit 208. Because the input impedance of the TIA and biquad filter circuit 208 is approximately 0 ohms, substantially all of the bias current Is1 flows into the TIA and biquad filter circuit 208 and is not used to charge any parasitic capacitance associated with the channel 206. FIG. 3 illustrates parasitic capacitance, Cpar, coupled between the conductors of the channel 206 in ground. These parasitic capacitances do not receive much or any current due to the very low input impedance of the TIA and biquad filter circuit 208.

Figure 4:
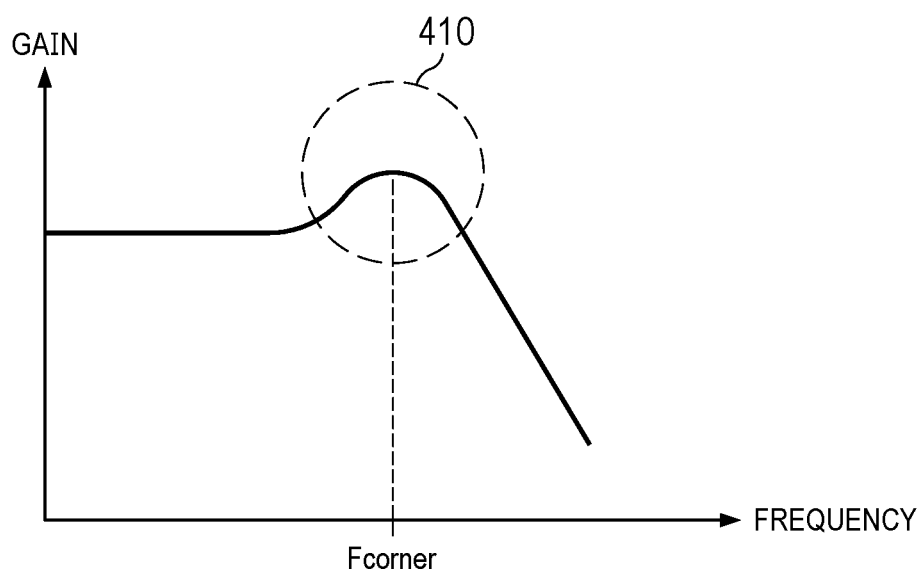
FIG. 4 is an example of a plot of the frequency response of the biquad filter of FIG. 3.

The TIA and biquad filter circuit 208 also implements a second-order, low-pass filter whose corner frequency is approximately equal to the fundamental frequency of CLOCK 105. The higher order harmonics of CLOCK 105 are attenuated by the low-pass filter. The output signal (the difference between the signals on outputs Vop and Von) is a sinusoidal signal whose frequency is approximately equal to the fundamental frequency of CLOCK 105. FIG. 4 is a frequency response graph illustrating gain versus frequency for the TIA and biquad filter circuit 208. The corner frequency is a function of the transconductance, gm, of transistors M1-M4 (assuming all of the gm's are approximately the same), C1, and C2, and is given as:

$$f_{corner} = \frac{gm}{\sqrt{C1 * C2}} \tag{1}$$

For transistors M1 and M3 (and M2 and M4) having the same transconductance gm, the magnitude of the gain at the corner frequency ($G_{corner}$) is given by:

$$G_{corner} = \frac{1}{2} * \sqrt{\frac{C1}{C2}} \tag{2}$$

An increase in gain (410) at approximately the corner frequency occurs due, in part (see Eq. 2 above), to the capacitance of capacitor C2. By causing an increase in the gain at approximately the corner frequency (Fcorner), which also is the fundamental frequency of CLOCK 105, the TIA and biquad filter circuit 208 causes an increase in the signal-to-noise ratio (SNR).

In an example, trimmable capacitors C1 and C2 are implemented as capacitor digital-to-analog converters (CDACs), which include multiple capacitors and corresponding switches. A CDAC input trim code may be stored in a register (not specifically shown) and used to select a particular capacitance to be implemented for each of capacitors C1 and C2. The trim code may be determined apriori (e.g., at the factory prior to shipment of the IC) or in the field by a system integrator constructing a system to include the IC containing the clock distribution system 200.

Figure 5:
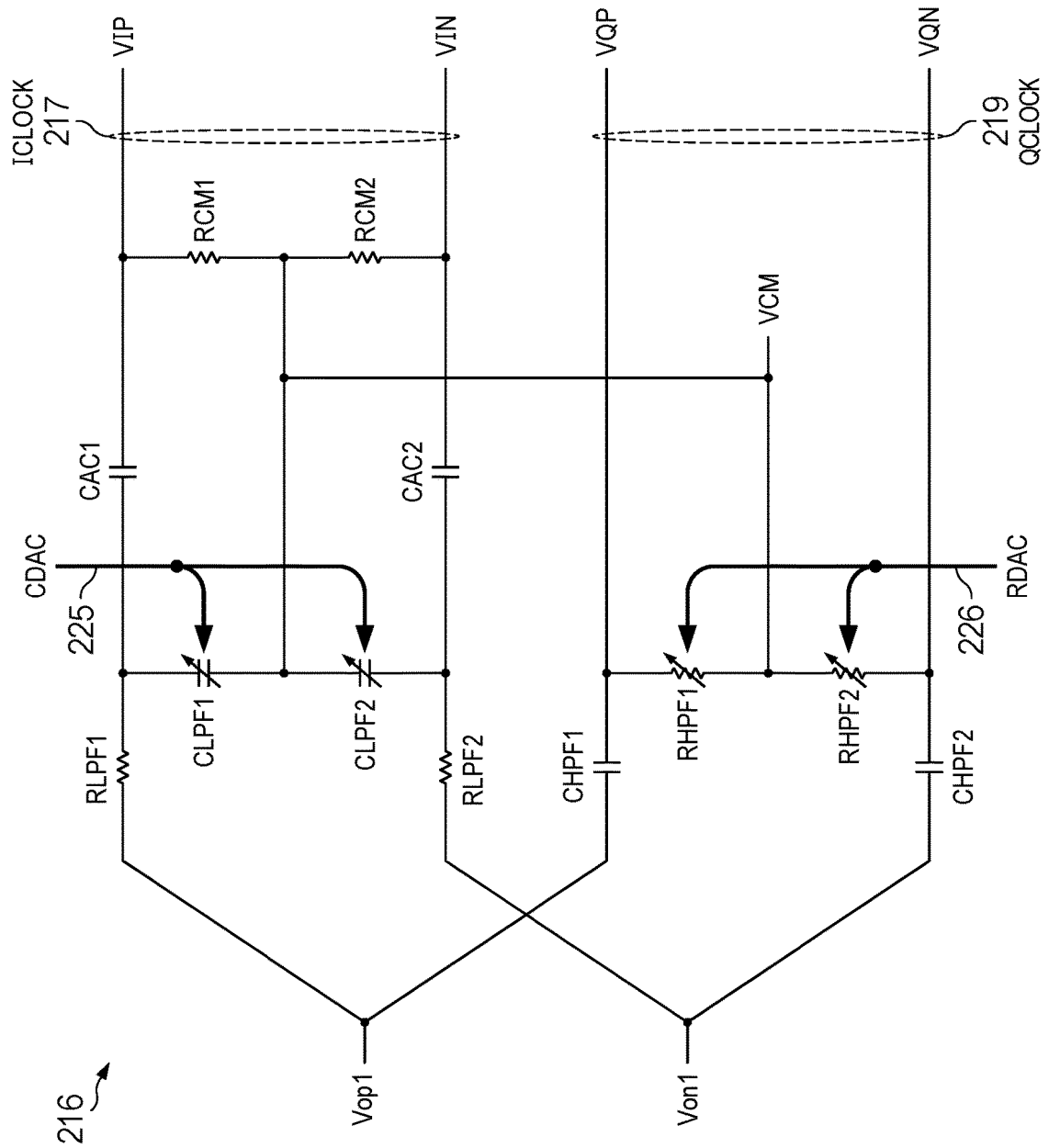
FIG. 5 is a schematic of an example polyphase filter usable in the clock distribution system of FIG. 2.

FIG. 5 is a schematic showing an example implementation of the polyphase filter 216. The polyphase filter 216 includes resistors RLPF1, RLPF2, RHPF1, RHPF2, RCM1, and RCM2 and capacitors CLPF1, CLPF2, CHPF1, CHPF2, CAC1, and CAC2. One terminal of resistor RLPF1 is coupled to a terminal of capacitor CLPF1 and a terminal of capacitor CAC1. Capacitors CLPF1 and CLPF2 are coupled together and to resistors RCM1 and RCM2. One terminal of resistor RLPF2 is coupled to a terminal of capacitor CLPF2 and a terminal of capacitor CAC2. Resistors RCM1 and RCM2 are coupled together between outputs VIP and VIN. Resistors RHPF1 and RHPF2 are coupled in series between capacitors CHPF1 and CHFP2.

As illustrated, the polyphase filter 216 in this example includes a low-pass filter and a high-pass filter coupled to each input Vop1 and Von1. The low-pass filter coupled to input Vop1 includes resistor RLPF1 and capacitor CLPF1. The high-pass filter coupled to input Vop1 includes capacitor CHPF1 and resistor RHFP1. The low-pass filter coupled to input Von1 includes resistor RLPF2 and capacitor CLPF2. The high-pass filter coupled to input Von1 includes capacitor CHPF2 and resistor RHFP2.

The component values for the resistors and capacitors of the low-pass and high-pass filters are such that the corner frequencies of the low-pass filters and the high-pass filters are approximately the same. For example, capacitors CLPF1 and CLPF2 and resistors RHPF1 and RHPF2 are trimmable such that the corner frequencies are approximately the same. In one example, capacitors CLPF1 and CLPF2 are each implemented as capacitive CDACs. Similarly, resistors RHPF1 and RHPF2 are implemented as resistive digital-to-analog converters (RDACs), which include multiple resistors coupled to corresponding switches. CDAC control signal 225 includes one or more bits to control the CDACs of capacitors CLPF1 and CLPF2 (using a code referred to below as the CDAC code). RDAC control signal 226 includes one or more bits to control the RDACs of resistors RHPF1 and RHPF2 (using a code referred to below as the RDAC code).

As previously mentioned, resistors RCM1 and RCM2 are coupled in series between VIP and VIN. Capacitor CAC1 is coupled between resistor RLPF1 and VIP, and capacitor CAC2 is coupled between RLPF2 and Vin. A common mode voltage, VCM, is applied to the connection between resistors RCM1 and RCM2, to the connection between capacitors CLPF1 and CLPF2, and to the connection between resistors RHPF1 and RHPF2. Outputs VQP and VQN are taken across the series combination of resistors RHPF1 and RHPF2.

Figure 7:
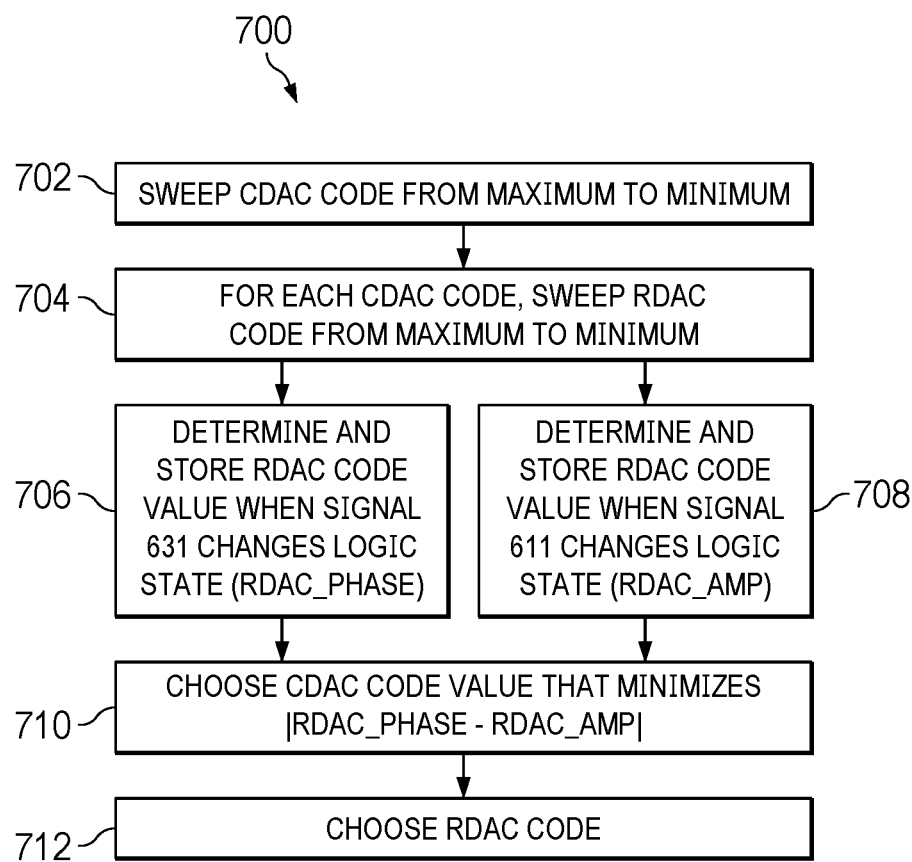
FIG. 7 is a flowchart illustrating an example calibration process for the calibration circuit of FIG. 6.

The voltage difference between VIP and VIN (ICLOCK 217) is nominally equal to the voltage difference between VQP and VQN (QCLOCK 219) and the phase difference between ICLOCK and QCLOCK is nominally 90 degrees. The calibration circuit 220 is used to calibrate the amplitude and/or phase to difference of the ICLOCK and QCLOCK. In one example, at power-up of the clock distribution system 200, the calibration circuit 220 performs a calibration process, an example of which is shown in FIG. 7 and described below.

Figure 6:
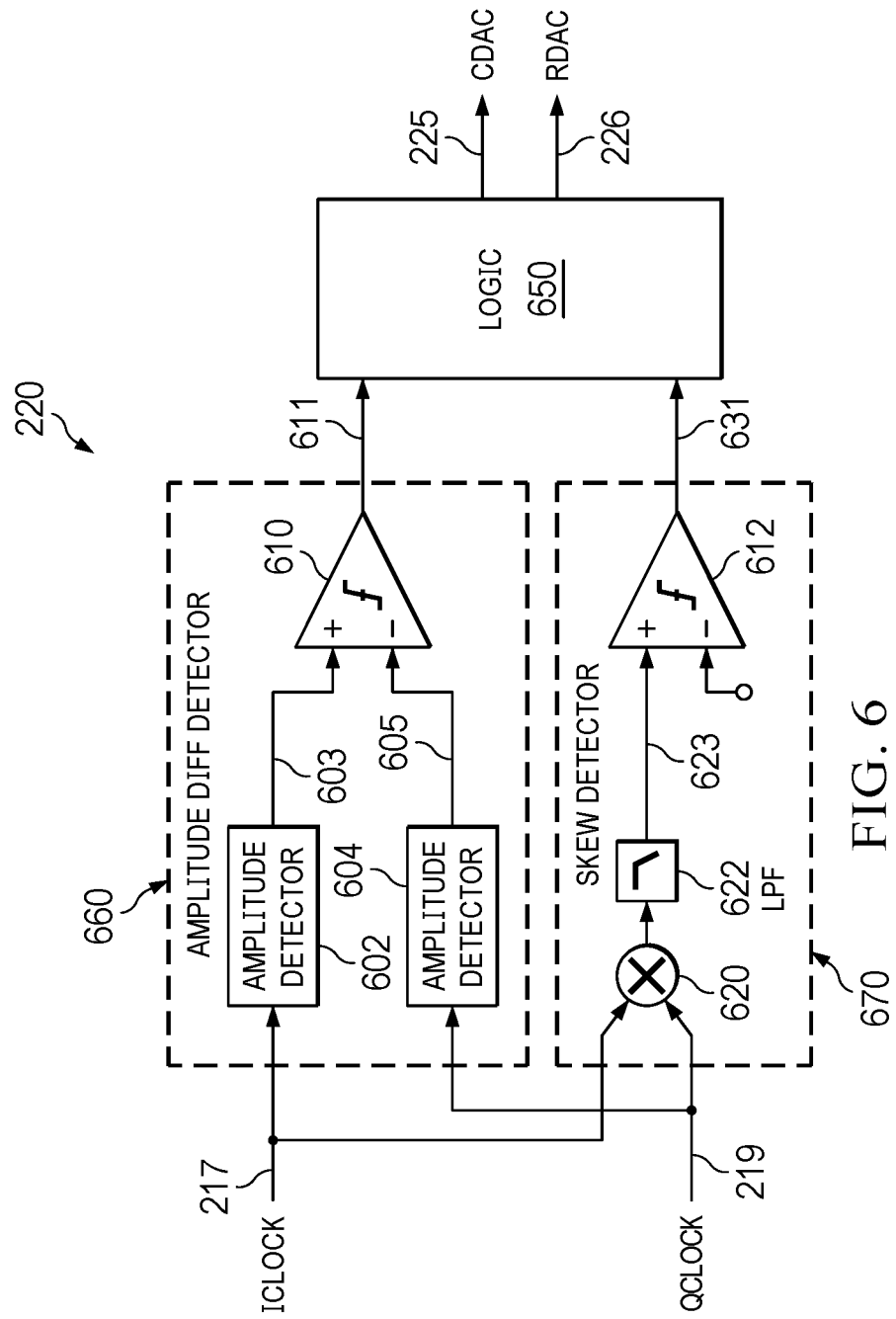
FIG. 6 is a schematic of an example calibration circuit usable in the clock distribution system of FIG. 2.

FIG. 6 is a block diagram of the calibration circuit 220. In this example, the calibration circuit includes an amplitude difference detector (AMP DIF DET 660), a skew detector 670, and logic 650. The AMP DIF DET 660 detects whether the ICLOCK amplitude is higher than the QCLOCK amplitude and provides a corresponding digital output. The skew detector 670 detects whether the difference between the phases of the I and Q clocks (ICLOCK and QCLOCK) is higher than 90 degrees or lower than 90 degrees and provides a corresponding digital output.

The AMP DIF DET 660 includes amplitude detectors 602 and 604 and comparator 610. The skew detector 670 includes a mixer 620, a low-pass filter 622, and a comparator 612. ICLOCK 217 is provided to an input of amplitude detector 602, and QCLOCK is provided to an input of amplitude detector 604. The outputs of the amplitude detectors 602 and 604 are coupled to the respective positive and negative inputs of comparator 610. The outputs of comparators 610 and 612 (signals 611 and 631) are coupled to logic 650.

ICLOCK 217 is provided to an input of amplitude detector 602 and an input of the mixer 620. QCLOCK 219 is provided to an input of amplitude detector 604 and another input of mixer 620. In an example, the amplitude detectors 602 and 604 are peak detectors that detect the peak voltage of ICLOCK 217 and QCLOCK 219, respectively. The output voltages, at outputs 603 and 605, from the amplitude detectors 602 and 604, respectively, are single-ended voltages (voltages with respect to a ground reference) that are provided to the positive (non-inverting, +) and negative (inverting, −) inputs of the comparator 610, as shown. The comparator 610 asserts its output signal, at output 611, as a logic high if the amplitude of ICLOCK 217 is higher than the amplitude of QCLOCK 219. The comparator 610 asserts its output signal, at the output 611, as a logic low if the amplitude of ICLOCK 217 is smaller than the amplitude of QCLOCK 219. The signal at the output 611 of the comparator 611 is provided to the logic 650.

The mixer 620 multiplies ICLOCK 217 by QCLOCK 219, and low-pass filter 622 filters the resulting mixed signal. If ICLOCK and QCLOCK are 90 degrees out-of-phase, the output signal, at output 623, of the low-pass filter 622 is 0V. If the phase difference between ICLOCK and QCLOCK is other than 90 degrees, the output signal, at the output 623, is not 0V (e.g., is a positive voltage). Comparator 612 compares the signal at the output 623 to a 0V reference signal, and the comparator's output signal, at the output 631, is provided to logic 650. The logic 650 provides the CDAC control signal 225 for capacitors CLPF1 and CLPF2 and the RDAC control signal 226 for resistors RH PF1 and RHPF2.

Logic 650 may be implemented as a finite state machine (FSM) and may include logic gates, flip-flops, memory, registers, etc. An example of the functionality implemented by logic 650 is shown in the flowchart of FIG. 7. The flowchart of FIG. 7 illustrates a method 700 shown as functional blocks 702-712, the functionality of which may or may not be performed in the order indicated.

At block 702, FIG. 7 shows that the method of block 704 is performed while sweeping the CDAC codes for capacitors CLPF1 and CLPF2 from a maximum CDAC code value to a minimum CDAC code value. In sweeping the CDAC codes, the capacitances of capacitors CLPF1 and CLPF2 are decremented from an upper capacitance value to a lower capacitance value.

At block 704, for each CDAC code value, the logic 650 sweeps the RDAC codes values for the resistors RHPF1 and RH PF2 from their maximum value to their minimum value. During the resistance sweep of block 704, at 706 the logic 650 determines the RDAC code value (RDAC_PHASE) for which the signal 631 changes logic state (e.g., from a logic 0 to a logic 1, or vice versa). Also, during the resistance sweep of block 704, at 708 the logic 650 determines the RDAC code value (RDAC_AMP) for which the signal at output 611 changes logic state (e.g., from a logic 0 to a logic 1, or vice versa). The RDAC code value (RDAC_PHASE) for which the signal at the output 631 changes logic state is the RDAC code value corresponding to the phase difference between ICLOCK and QCLOCK being closest to 90 degrees. The RDAC code value (RDAC_AMP) for which signal 611 changes logic state is the RDAC code value corresponding to the amplitudes of ICLOCK and QCLOCK being approximately equal.

A pair of RDAC code values is determined at blocks 706 and 708 for each CDAC code value and stored in memory or registers within logic 650. At 710, the logic 650 chooses the CDAC code value from the CDAC code sweep of block 702 that minimizes the difference between the RDAC code values for each such CDAC code value.

At block 712, the logic 650 chooses or determines the RDAC code value in accordance with one of three possible techniques. First, the logic 650 may choose the RDAC code value that resulted in the change of the logic state of the signal at output 631 for the CDAC code value chosen in block 710. Second, the logic 650 may choose the RDAC code value that resulted in the change of the logic state of the signal at output 611 for the CDAC code value chosen in block 710. Third, the logic 650 may average the RDAC code values that resulted in the logic state changes of the signals at outputs 611 and 631 for the CDAC code value chosen in block 710.

The CDAC code value chosen in block 710 and the RDAC code value chosen or determined in block 712 are provided to the polyphase filter 216 as control signals 225 and 226, respectively. These particular CDAC and RDAC code values configure the polyphase filter 216 to prioritize either (a) that the ICLOCK and QCLOCK amplitudes are as identical as possible, or (b) prioritize the phase difference between ICLOCK and QCLOCK being as close to 0 degrees as possible.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

Also, in this description, the recitation "based on" means "based at least in part on." Therefore, if X is based on Y, then X may be a function of Y and any number of other factors.

A device "configured to" perform a task or function may be configured (e.g., programmed and/or hardwired) at a time of manufacturing by a manufacturer to perform the function and/or may be configurable (or reconfigurable) by a user after manufacturing to perform the function and/or other additional or alternative functions. The configuring may be through firmware and/or software programming of the device, through a construction and/or layout of hardware components and interconnections of the device, or a combination thereof.

As used herein, the terms "terminal", "node", "interconnection", "pin" and "lead" are used interchangeably. Unless specifically stated to the contrary, these terms are generally used to mean an interconnection between or a terminus of a device element, a circuit element, an integrated circuit, a device or other electronics or semiconductor component.

A circuit or device described herein as including certain components may instead be adapted to be coupled to those components to form the described circuitry or device. For example, a structure described as including one or more semiconductor elements (such as transistors), one or more passive elements (such as resistors, capacitors, and/or inductors), and/or one or more sources (such as voltage and/or current sources) may instead include only the semiconductor elements within a single physical device (e.g., a semiconductor die and/or integrated circuit (IC) package) and may be adapted to be coupled to at least some of the passive elements and/or the sources to form the described structure either at a time of manufacture or after a time of manufacture, for example, by an end-user and/or a third-party.

While the use of particular transistors are described herein, other transistors (or equivalent devices) may be used instead with little or no change to the remaining circuitry. For example, a field effect transistor ("FET") (such as an n-channel FET (NFET) or a p-channel FET (PFET)), a bipolar junction transistor (BJT—e.g., NPN transistor or PNP transistor), insulated gate bipolar transistors (IGBTs), and/or junction field effect transistor (JFET) may be used in place of or in conjunction with the devices disclosed herein. The transistors may be depletion mode devices, drain-extended devices, enhancement mode devices, natural transistors or other types of device structure transistors. Furthermore, the devices may be implemented in/over a silicon substrate (Si), a silicon carbide substrate (SiC), a gallium nitride substrate (GaN) or a gallium arsenide substrate (GaAs).

References may be made in the claims to a transistor's control input and its terminals. In the context of a FET, the control input is the gate, and the terminals are the drain and source. In the context of a BJT, the control input is the base, and the terminals are the collector and emitter.

References herein to a FET being "on" means that the conduction channel of the FET is present and drain current may flow through the FET. References herein to a FET being "off" means that the conduction channel is not present and drain current does not flow through the FET. An "off" FET, however, may have current flowing through the transistor's body-diode.

Circuits described herein are reconfigurable to include additional or different components to provide functionality at least partially similar to functionality available prior to the component replacement. Components shown as resistors, unless otherwise stated, are generally representative of any one or more elements coupled in series and/or parallel to provide an amount of impedance represented by the resistor shown. For example, a resistor or capacitor shown and described herein as a single component may instead be multiple resistors or capacitors, respectively, coupled in parallel between the same nodes. For example, a resistor or capacitor shown and described herein as a single component may instead be multiple resistors or capacitors, respectively, coupled in series between the same two nodes as the single resistor or capacitor.

While certain elements of the described examples are included in an integrated circuit and other elements are external to the integrated circuit, in other example embodiments, additional or fewer features may be incorporated into the integrated circuit. In addition, some or all of the features illustrated as being external to the integrated circuit may be included in the integrated circuit and/or some features illustrated as being internal to the integrated circuit may be incorporated outside of the integrated. As used herein, the term "integrated circuit" means one or more circuits that are: (i) incorporated in/over a semiconductor substrate; (ii) incorporated in a single semiconductor package; (iii) incorporated into the same module; and/or (iv) incorporated in/on the same printed circuit board.

Uses of the phrase "ground" in the foregoing description include a chassis ground, an Earth ground, a floating ground, a virtual ground, a digital ground, a common ground, and/or any other form of ground connection applicable to, or suitable for, the teachings of this description. In this description, unless otherwise stated, "about," "approximately" or "substantially" preceding a parameter means being within +/−10 percent of that parameter or, if the parameter is zero, a reasonable range of values around zero.

Modifications are possible in the described embodiments, and other embodiments are possible, within the scope of the claims.

What is claimed is:

1. An integrated circuit (IC), comprising:
a voltage-to-current converter circuit having a first voltage input, a second voltage input, a first current terminal, and a second current terminal;
a first transistor having a control input and first and second terminals, the second terminal coupled to the first current terminal;
a second transistor having a control input and first and second terminals, the second terminal of the second transistor coupled to the second current terminal;

a third transistor having a control input and first and second terminals, the control input of the second transistor coupled to the second terminal of the third transistor, the first terminal of the third transistor coupled to a supply voltage terminal;

a fourth transistor having a control input and first and second terminals, the control input of the first transistor coupled to the second terminal of the fourth transistor, the first terminal of the fourth transistor coupled to the supply voltage terminal;

a first resistor coupled between the first terminal of the first transistor and the second terminal of the third transistor;

a second resistor coupled between the first terminal of the second transistor and the second terminal of the fourth transistor;

a first capacitor coupled between the first terminals of the first and second transistors; and a second capacitor coupled between the second terminals of the first and second transistors.

2. The IC of claim 1, further comprising:
a third resistor coupled between the control input of the third transistor and the supply voltage terminal; and
a fourth resistor coupled between the control input of the fourth transistor and the supply voltage terminal.

3. The IC of claim 2, wherein the first, second, third, and fourth transistors are field effect transistors that each have a channel, in which the channels have a same conductivity type.

4. The IC of claim 2, wherein the first, second, third, and fourth transistors are each n-channel field effect transistors.

5. The IC of claim 1, wherein one of the first capacitor or the second capacitor or both the first and the second capacitors is a trimmable capacitor.

6. The IC of claim 1, further, comprising:
a polyphase filter coupled to the first terminal of the first transistor and the first terminal of the second transistor, the polyphase filter having a first output and a second output; and
a calibration circuit coupled to the first output and the second output, the calibration circuit having a control output coupled to the polyphase filter, and the calibration circuit configured to calibrate at least one of an amplitude or phase difference of signals produced by the polyphase filter on the first and second outputs.

7. The IC of claim 6, wherein the polyphase filter includes first and second capacitors, wherein the first capacitor is a trimmable capacitor, and the second capacitor is a trimmable capacitor.

8. An integrated circuit (IC), comprising:
a first circuit including:
a first field effect transistor (FET) having first and second terminals and a first control input;
a second FET having first and second terminals and a first control input;
a first resistor coupled between the second terminal of the second FET and the first terminal of the first FET;
a third FET having first and second terminals and a first control input;
a fourth FET having first and second terminals and a first control input;
a second resistor coupled between the second terminal of the fourth FET and the first terminal of the third FET;
a first capacitor coupled between the first terminal of the first FET and the first terminal of the third FET;
a second capacitor coupled between the second terminal of the first FET and the second terminal of the third FET; and
a second circuit including:
a fifth FET having a first terminal coupled to the second terminal of the first FET; and
a sixth FET having a first terminal coupled to the second terminal of the third FET.

9. The IC of claim 8, further comprising:
a third resistor coupled between the first control input of the second FET and the first terminal of the second FET; and
a fourth resistor coupled between the first control input of the fourth FET and the first terminal of the fourth FET.

10. The IC of claim 8, wherein the first, second, third, and fourth FETs each have a channel, in which the channels have a same conductivity type.

11. The IC of claim 10, wherein one of the first capacitor or the second capacitor or both the first and second capacitors is a trimmable capacitor.

12. The IC of claim 8, wherein the first, second, third, fourth, fifth, and sixth FETs are each n-channel field effect transistors.

13. The IC of claim 8, further, comprising:
a polyphase filter coupled to the first terminals of the first and second FETs, the polyphase filter having a first output and a second output; and
a calibration circuit coupled to the first output and the second output, the calibration circuit having a control output coupled to the polyphase filter, and the calibration circuit configured to calibrate at least one of an amplitude or phase difference of signals produced by the polyphase filter on the first and second outputs.

14. The IC of claim 13, wherein the polyphase filter includes first and second capacitors, the first capacitor is a trimmable capacitor, and the second capacitor is a trimmable capacitor.

15. The IC of claim 13, wherein the calibration circuit comprises:
an amplitude difference detector coupled to the first and second outputs, the amplitude difference detector configured to determine an amplitude difference between signals on the first and second outputs; and
a skew detector coupled to the first and second outputs, the skew detector configured to detect whether a difference between the phases of signals on the first and second outputs is higher than 90 degrees or lower than 90 degrees.

16. The IC of claim 15, wherein the amplitude difference detector comprises:
a first amplitude detector having a first amplitude detector input and a first amplitude detector output;
a second amplitude detector having a second amplitude detector input and a second amplitude detector output; and
a comparator coupled to the first and second amplitude detector outputs.

17. A system, comprising:
a voltage-to-current converter circuit having a first voltage terminal, a second voltage terminal, a first current terminal, and a second current terminal;
a transimpedance amplifier (TIA) and biquad filter circuit having a first TIA and biquad filter input coupled to the first current terminal and having a second TIA and biquad filter input coupled to the second current terminal, the transimpedance amplifier includes cross-coupled transistors configured to reduce an input impedance of the TIA and biquad filter circuit, the TIA and biquad filter circuit having first and second filter outputs;
a polyphase filter coupled to the first and second filter outputs, the polyphase filter having third and fourth filter outputs and first and second control inputs; and
a calibration circuit coupled to the third and fourth filter outputs and to the first and second control inputs.

18. The IC of claim 17, wherein the polyphase filter comprises:
a first high-pass filter including a first trimmable resistor coupled to the first control input;
a second high-pass filter including a second trimmable resistor coupled to the first control input;
a first low-pass filter including a first trimmable capacitor coupled to the second control input; and
a second low-pass filter including a second trimmable capacitor coupled to the second control input.

19. The IC of claim 17, wherein the calibration circuit comprises:
an amplitude difference detector coupled to the third and fourth filter outputs, the amplitude difference detector configured to determine an amplitude difference between signals on the third and fourth filter outputs; and
a skew detector coupled to the third and fourth filter outputs, the skew detector configured to detect whether a difference between the phases of signals on the third and fourth filter outputs is higher than 90 degrees or lower than 90 degrees.

20. The IC of claim 17, wherein the first, second, third, and fourth transistors are field effect transistors that each have a channel having a same conductivity type.

* * * * *